United States Patent
Sakao et al.

(10) Patent No.: US 8,298,957 B2
(45) Date of Patent: Oct. 30, 2012

(54) PLASMA ETCHIMG METHOD AND PLASMA ETCHING APPARATUS

(75) Inventors: Yosuke Sakao, Nirasaki (JP); Kensuke Kamiutanai, Hsin-Chu (TW); Akitaka Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 795 days.

(21) Appl. No.: 12/320,903

(22) Filed: Feb. 6, 2009

(65) Prior Publication Data

US 2009/0233450 A1 Sep. 17, 2009

Related U.S. Application Data

(60) Provisional application No. 61/071,367, filed on Apr. 24, 2008.

(30) Foreign Application Priority Data

Feb. 7, 2008 (JP) .................................. 2008-027861

(51) Int. Cl.
H01L 21/302 (2006.01)
(52) U.S. Cl. .......... 438/716; 438/702; 438/714; 134/1.1
(58) Field of Classification Search .................. 438/706, 438/710, 714, 716, 723, 702, 758, 759; 134/1.1, 134/1.2; 216/58, 67
See application file for complete search history.

(56) References Cited

U.S. PATENT DOCUMENTS

| | | | | |
|---|---|---|---|---|
| 6,533,953 | B2 * | 3/2003 | Allen, III | 216/67 |
| 7,662,235 | B2 * | 2/2010 | Yoshida et al. | 134/1 |
| 2001/0051439 | A1 * | 12/2001 | Khan et al. | 438/710 |

FOREIGN PATENT DOCUMENTS

| | | |
|---|---|---|
| JP | 2005-033062 | 2/2005 |
| JP | 2007-115839 | 5/2007 |
| JP | 2007-227829 | 9/2007 |
| JP | 2007-281414 | 10/2007 |

* cited by examiner

Primary Examiner — Lan Vinh
(74) Attorney, Agent, or Firm — Smith, Gambrell & Russell, LLP

(57) ABSTRACT

The present invention is a plasma etching method comprising: a cleaning step (a) in which a cleaning gas is supplied into a processing vessel and the cleaning gas is made plasma, so that a deposit adhering to an inside of the processing vessel is removed by means of the plasma; a film depositing step (b), succeeding the cleaning step (a), in which a film depositing gas containing carbon and fluorine is supplied into the processing vessel and the film depositing gas is made plasma, so that a film containing carbon and fluorine is deposited on the inside of the processing vessel by means of the plasma; an etching step (c), succeeding the film depositing step (b), in which a substrate is placed on a stage inside the processing vessel, and an etching gas is supplied into the processing vessel and the etching gas is made plasma, so that the substrate is etched by means of the plasma; and an unloading step (d), succeeding the etching step (c), in which the substrate is unloaded from the processing vessel; wherein, after the unloading step (d) has been finished, the cleaning step (a) to the unloading step (d) are repeated again.

5 Claims, 14 Drawing Sheets

| SAMPLE | RADIOFREQUENCY POWER | | FILM DEPOSITING GAS(sccm) | | | | | PROCESS PERIOD | NUMBER OF YTTRIUM ATOMS (×10⁻¹⁰atom/cm²) | ETCHING RATE | |
|---|---|---|---|---|---|---|---|---|---|---|---|
| | UPPER ELECTRODE | LOWER ELECTRODE | CHF3 | CH2F2 | CH3F | CH4F8 | He | | | AVERAGE VALUE (nm/min) | IN-PLANE UNIFORMITY(%) |
| 1 | | | | | | | | | | 187 | ±3.8 |
| 2 | 200 | 0 | 45 | | | | 500 | 30 | 95.9 | 162 | ±4.5 |
| 3 | 200 | 0 | | 45 | | | 500 | 30 | 83.3 | 164 | ±4.6 |
| 4 | 200 | 0 | | | 45 | | 500 | 30 | 67.6 | 185 | ±4.7 |
| 5 | 200 | 0 | 250 | | 140 | | | 30 | 59.8 | 151 | ±6.3 |
| 6 | 600 | 0 | 250 | | 140 | | | 30 | 75.1 | | |
| 7 | 600 | 0 | 210 | 40 | 140 | | | 30 | 3.9 | | |
| 8 | 600 | 0 | 210 | | 140 | 40 | | 30 | 3.4 | | |
| 9 | 600 | 0 | 250 | | 140 | | | 30 | 6.5 | 162 | ±9.8 |
| 10 | 600 | 0 | 250 | | 140 | | | 90 | 40.1 | | |
| 11 | 600 | 0 | 250 | 40 | | | | 90 | — | | |
| 12 | 600 | 0 | 250 | 40 | 40 | | | 30 | — | 150 | ±5.1 |
| 13 | 600 | 0 | 250 | 40 | | | | 30 | 44.5 | 145 | ±4.2 |
| 14 | 600 | 0 | 250 | | | | 140 | 90 | 35.9 | | |
| 15 | 600 | 0 | 250 | | | | 250 | 90 | 41.6 | 161 | ±4.5 |
| 16 | 600 | 0 | | | 140 | | | 90 | 55.0 | | |
| 17 | 600 | 0 | 250 | | 70 | | | 90 | 23.3 | | |

FIG. 6

PLASMA ETCHIMG METHOD AND PLASMA ETCHING APPARATUS

CROSS REFERENCE TO PRIOR APPLICATIONS

This application claims priority from U.S. Provisional Application No. 61/071,367 filed on Apr. 24, 2008 and Japanese Patent Application No. 2008-027861 filed on Feb. 7, 2008. The entire contents of these applications are incorporated herein by reference.

FIELD OF THE INVENTION

The present invention relates to a technique for performing a plasma etching process to a substrate.

BACKGROUND ART

In a manufacturing method of a semiconductor substrate, such as a semiconductor wafer W (hereinafter referred to as "wafer") and an FPD substrate, there is a step for subjecting the substrate to an etching process under a reduced-pressure atmosphere. An example of a plasma etching apparatus for performing this step is briefly described with reference to FIG. 13.

In FIG. 13, the reference number 1 depicts a vacuum chamber. Disposed inside the vacuum chamber 1 is a stage 11 on which a substrate, e.g., a wafer W can be placed. There is disposed a process gas supply part 12 serving also as an upper electrode for generating a plasma in such a manner that the process gas supply part 12 is opposed to the stage 11. While a process gas is supplied from the process gas supply part 12 into the vacuum chamber 1, the vacuum chamber 1 is evacuated by a vacuum pump, not shown, through an exhaust channel 13. In addition, a radiofrequency power is applied from a radiofrequency power source 14 to the process gas supply part 12, so that a plasma of the process gas is generated in a space above the wafer W. Under this state, an etching process for the wafer W is performed. At this time, a temperature of the wafer is adjusted by a temperature adjusting means, not shown, incorporated in the stage 11.

When an etching process is performed, as shown in FIG. 14, for example, there is a possibility that an etching rate at a peripheral area of the wafer W may be higher than an etching rate at a central area thereof, depending on the kind of a film. In this case, as compared with the central area of the wafer w, the peripheral area thereof tends to be side-etched, which impairs the verticality of an etched shape. As cases in which this tendency can be noticeably seen, there are known an etching process of a gate electrode made of, e.g., polysilicon, which is used for a space in a gate structure, and an etching process of an anti-reflection film of a resist.

The reason for the higher etching rate in the peripheral area of the wafer W is inferred that the amount of active species, generated by the etching gas which has been made plasma, is larger in an area nearer to a side wall than in a central area in the vacuum chamber 1. In FIG. 14, the reference character P schematically depicts a state of the plasma.

On the other hand, in the aforementioned etching apparatus, various methods are employed for controlling an etching rate so as to reliably obtain a desired profile of the etching rate in a plane of the wafer W. One of the desired profiles is a profile of a uniform etching rate over all the plane of the wafer W.

In order to achieve this profile, as described in JP2005-033062A, for example, there may be employed a structure in which a focus ring is disposed on an area surrounding the wafer W on the stage 11. Alternatively, there may be employed a structure in which a wafer temperature is controlled by the temperature adjusting means incorporated in the stage 11 such that the wafer temperature is differed between the central area and the peripheral area of the wafer, or a structure in which a supply rate of a process gas from the process gas supply part 12 is controlled such that the supply rate is differed between the central area and the peripheral area of the wafer W. Alternatively, as described in JP2007-227829A, there may be employed a structure in which the process gas supply part has an invented shape.

However, in any conventional method of controlling the temperature of the stage 11, a temperature difference to be controlled is limited. Further, in any conventional method of controlling the supply rate of the process gas, the variation amount achieved in a resultant etching-rate profile is small (not sufficient). Furthermore, in the methods described in JP2005-033062A and JP2007-227829A, although a desired result can be obtained depending on the kind of a film to be etched, a satisfactory result cannot be obtained in the etching process of a gate electrode and in the etching process of an anti-reflection film.

The vacuum chamber 1 is formed of aluminum or the like. During the etching process, the vacuum chamber 1 itself, the stage 11 disposed therein, and other structural elements such as the focus ring are exposed to the plasma, and thus are in contact with the active species of the etching gas. Therefore, due to the repeated etching processes, there is a possibility that a metal component of the inner surface of the vacuum chamber 1 and/or a metal component of an outer surface of the structural elements (parts) may be etched and scattered, resulting in generation of particles. Thus, surfaces of structural elements which are likely to be etched by the plasma inside the vacuum chamber 1, such as the inner wall surface of the vacuum chamber 1 and a circumferential surface of the stage 11, are coated with Y (yttria), so as to prevent particle contamination caused by the above undesired etching.

However, when an etching condition is varied, there is a possibility that the yttria itself may be etched. In this case, the wafer W may be contaminated by the yttria. Therefore, there has been sought a technique for making the yttria surface denser and harder so as to make it difficult that the yttria surface is etched, for example, by heating the yttria surface coated on the vacuum chamber 1 and the like, by radiating a laser beam thereonto, and so on. However, this type of technique has not yet been in practical use.

Moreover, when the vacuum chamber 1 and the structural elements are exhausted by the etching, life spans thereof are shortened. Thus, an exchange cycle is shortened so that a cost for a part per time (COC) is increased, which invites an expensive price of the apparatus.

SUMMARY OF THE INVENTION

The present invention has been made in view of the above circumstances. The object of the present invention is to provide a plasma etching method and a plasma etching apparatus, in which a profile of an etching rate can be controlled such that an etching rate at a peripheral area of a substrate is smaller than an etching rate at a central area thereof, and in which generation of particles, which was conventionally caused by a processing vessel and other structural elements inside the processing vessel being etched, can be prevented.

The present invention is a plasma etching method comprising: a cleaning step (a) in which a cleaning gas is supplied into a processing vessel and the cleaning gas is made plasma, so that a deposit adhering to an inside of the processing vessel is removed by means of the plasma; a film depositing step (b), succeeding the cleaning step (a), in which a film depositing gas containing carbon and fluorine is supplied into the processing vessel and the film depositing gas is made plasma, so that a film containing carbon and fluorine is deposited on the inside of the processing vessel by means of the plasma; an etching step (c), succeeding the film depositing step (b), in which a substrate is placed on a stage inside the processing vessel, and an etching gas is supplied into the processing vessel and the etching gas is made plasma, so that the substrate is etched by means of the plasma; and an unloading step (d), succeeding the etching step (c), in which the substrate is unloaded from the processing vessel; wherein, after the unloading step (d) has been finished, the cleaning step (a) to the unloading step (d) are repeated again.

According to the present invention, after the film containing carbon and fluorine has been formed on the inside of the processing vessel, the substrate is subjected to the etching process. Thus, active species, generated by the etching gas being made plasma, react with the film containing carbon and fluorine which has been formed on an inner surface of a sidewall of the processing vessel. Owing to this reaction, the active species are consumed in an area near to the inside sidewall of the processing vessel. Thus, an amount of the active species to be used for etching the substrate is decreased, whereby an etching-rate profile can be controlled such that an etching rate at a peripheral area of the substrate is smaller than an etching rate at a central area thereof. As a result, in the etching process for a film such as a gate oxidation film in which an etching rate at a peripheral area of the film is likely to be higher than an etching rate at a central area thereof, it is easy to control etching conditions so as to improve in-plane uniformity of the etching rate.

In addition, owing to the formation of the film containing carbon and fluorine on the inside of the processing vessel, an inner wall surface of the processing vessel and/or an outer surface of a structural element such as the stage can be restrained from being directly exposed to the active species of the etching gas during the etching process. Thus, the inner wall surface of the processing vessel and the outer surface of the structural element such as the stage can be protected from the sputtering of the etching gas.

Thus, it can be restrained that a metal component constituting the inner wall surface of the processing vessel and/or the outer surface of the structural element such as the stage is etched and scattered, and that the scattered metal pieces adhere to the substrate resulting in contamination of the substrate. As a result, life spans of the processing vessel and the structural element can be elongated.

The film depositing step (b) may be performed, with a dummy substrate being placed on the stage.

In addition, the cleaning step (a) to the unloading step (d) may be performed for every substrate.

In addition, for example, the cleaning gas is one of an oxygen gas, a mixture gas of an oxygen gas and an $SF_6$ gas, and a mixture gas of an oxygen gas and an $NF_3$ gas.

In addition, for example, the film depositing gas is a CxFyHz gas (in which x and y are integers not less than 1, and z is 0 or an integer not less than 1).

In addition, for example, the deposit includes a film containing carbon and fluorine deposited on the inside of the processing vessel.

Alternatively, the present invention is a plasma etching apparatus comprising: a processing vessel including a stage for a substrate; a first supply unit configured to supply a cleaning gas into the processing vessel so as to remove a deposit adhering to an inside of the processing vessel; a second supply unit configured to supply a film depositing gas containing carbon and fluorine into the processing vessel so as to form a film containing carbon and fluorine on the inside of the processing vessel; a third supply unit configured to supply an etching gas into the processing vessel so as to etch a substrate placed on the stage inside the processing vessel; a plasma generating unit configured to make plasma the respective gases that have been supplied into the processing vessel; and a control unit configured to control the respective units; wherein: the control unit controls the respective units such that: a cleaning step in which the cleaning gas is made plasma inside the processing vessel, so that a deposit adhering to an inside of the processing vessel is removed by means of the plasma; a film depositing step, succeeding the cleaning step, in which the film depositing gas is made plasma inside the processing vessel, so that a film containing carbon and fluorine is deposited on the inside of the processing vessel by means of the plasma; an etching step, succeeding the film depositing step, in which the etching gas is made plasma inside the processing vessel, so that the substrate is etched by means of the plasma; and an unloading step, succeeding the etching step, in which the substrate is unloaded from the processing vessel; wherein, after the unloading step has been finished, the cleaning step to the unloading step are repeated again.

Preferably, an inner wall surface of the processing vessel and a side surface of the stage are coated with yttria.

In addition, for example, the cleaning gas is one of an oxygen gas, a mixture gas of an oxygen gas and an $SF_6$ gas, and a mixture gas of an oxygen gas and an $NF_3$ gas.

In addition, for example, the film depositing gas is a CxFyHz gas (in which x and y are integers not less than 1, and z is 0 or an integer not less than 1).

Alternatively, the present invention is a storage medium storing a computer program executable on a computer, wherein the computer program includes steps for implementing the plasma etching method having the aforementioned features.

BRIEF DESCRIPTION OF THE DRAWINGS

FIG. 6 is a table showing in detail conditions of examples (samples) conducted for confirming an effect by the present invention.

BEST MODE FOR CARRYING OUT THE INVENTION

Figure 1:
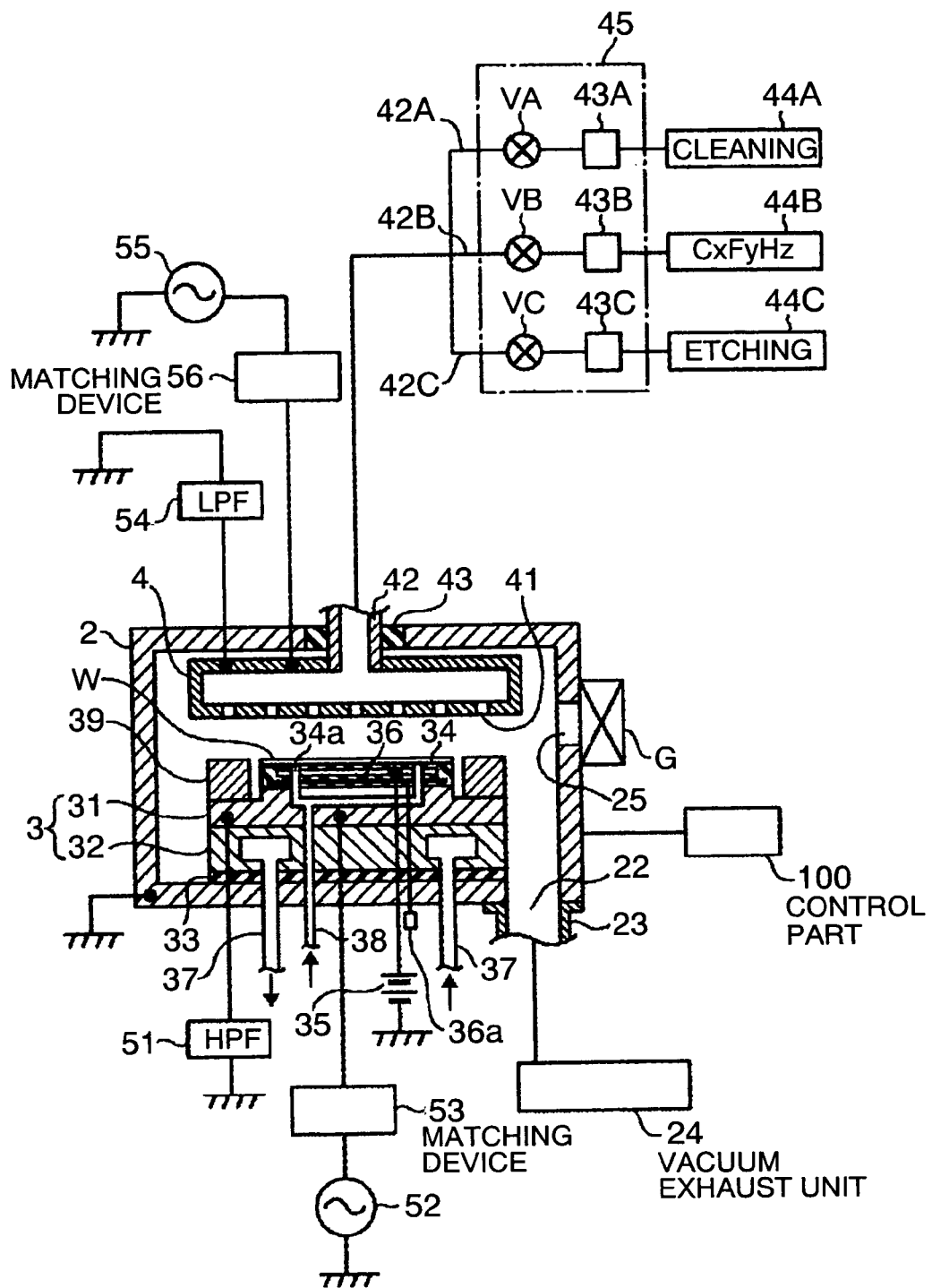
FIG. 1 is a sectional view showing one embodiment of an etching apparatus according to the present invention.

An outline of one embodiment of an etching method according to the present invention is described at first.

In this embodiment, prior to plasma-etching a substrate such as a wafer W inside a processing vessel 2, a cleaning step is firstly performed for removing a deposit adhering to the inside of the processing vessel 2. The cleaning step is as follows. Namely, a cleaning gas is supplied into the processing vessel 2, and then the cleaning gas is made plasma, so that the deposit is decomposed by the plasma and removed.

As described below, the deposit herein means: a film containing carbon and fluorine, which has been deposited on an inner surface of the processing vessel 2 and an outer surface of a structural element in the processing vessel 2; and another material, which has been deposited thereon while the wafer W is etched. As a cleaning gas, there may be used an oxygen gas ($O_2$ gas), a mixture gas of an oxygen gas and an $SF_6$ gas, a mixture gas of an oxygen gas and an $NF_3$ gas, or the like.

Then, a film depositing step for depositing a film containing carbon and fluorine is performed to an area exposed to a plasma in the processing vessel 2. The film depositing step is performed by supplying a film depositing gas containing carbon and fluorine into the processing vessel 2 and making plasma the film depositing gas. Thus, a film 21 containing carbon and fluorine is deposited on respective parts (areas), with which the film depositing gas has been brought into contact in the processing vessel 2, i.e., on the inner wall surface of the processing vessel 2 and/or on outer surfaces of structural elements such as a stage for the wafer W and a focus ring, not shown. Hereinafter, the film 21 containing carbon and fluorine is referred to as a CF film (fluorine-added carbon film). As the film depositing gas, there may be used a CxFyHz gas (in which x and y are integers not less than 1, and z is 0 or an integer not less than 1). For example, a $CHF_{13}$ gas, a $CH_2F_2$ gas, and a $CH_3F$ gas can be used. One of these gases may be independently used. Two of these gases may be used in combination, or all (3 kinds) of these gases may be used in combination. Further, a $C_4FB$ gas and an He gas may be combined therewith.

Then, a wafer W is placed inside the processing vessel 2, and an etching process is performed to the wafer W. The etching step is performed by supplying an etching gas into the processing vessel 2 and making the etching gas plasma. A film to be etched is a gate electrode made of polysilicon or an anti-reflection film of a resist. As an etching gas, there is used such a gas that can react with the CF film 21 which has been formed inside the processing vessel 2 in the film depositing step, while the reaction exerts no adverse effect on the etching process of a film on the surface of the wafer W. To be specific, when an SiN film is etched, a combination of a $CF_4$ gas, a $CH_3F$ gas, and an Ar gas is used. On the other hand, when a gate electrode made of polysilicon is etched, an HBr gas and an $O_2$ gas or the like are used.

Next, an embodiment of a plasma etching apparatus for carrying out the plasma etching method according to the present invention is described with reference to FIG. 1.

The plasma etching apparatus shown in FIG. 1 includes a processing vessel 2 formed of a vacuum chamber, a stage 3 arranged at a center on a bottom surface in the processing vessel 2, and an upper electrode 4 arranged above the stage 3 such that the upper electrode 4 and the stage 3 are opposed to each other.

The processing vessel 2 is grounded. A vacuum exhaust unit 24 is connected through an exhaust pipe 23 to an exhaust port 22 formed in the bottom surface of the processing vessel 2. A pressure adjusting part, not shown, is connected to the vacuum exhaust unit 24. Thus, the inside of the processing vessel 2 can be maintained at a desired vacuum degree. A transfer opening 25 for the wafer W is formed in a wall surface of the processing vessel 2. The transfer opening 25 can be opened and closed by a gate valve G.

The stage 3 includes a lower electrode 31 and a support member 32 supporting the lower electrode 31 from below. The stage 3 is disposed on the bottom surface of the processing vessel 2 via an insulation member 33. Arranged in an upper portion of the stage 3 is an electrostatic chuck 34 to which a voltage is applied from a high-voltage D.C. power supply 35. Thus, the wafer W can be electrostatically absorbed on the stage 3. The stage 3 incorporates a heater 36 connected to a power supply 36a, whereby the wafer W on the stage 3 can be heated. Further, formed in the stage 3 is a temperature adjusting channel 37 through which a predetermined temperature adjusting medium passes, so that the wafer W can be maintained at a set temperature when the wafer W is etched. Furthermore, formed inside the stage 3 is a gas channel 38 through which a thermal conductive gas such as an He (helium) gas is supplied as a backside gas. The gas channel 38 is opened in an upper surface of the stage 3 at a plurality of locations. These openings are in communication with through holes 34a formed in the electrostatic chuck 34.

The lower electrode 31 is grounded via a highpass filter (HPF) 51. Connected via a matching device 53 to the lower electrode 31 is a radiofrequency power supply 52 that supplies a radiofrequency of 13.56 MHz. The radiofrequency, which is supplied from the radiofrequency power supply 52 as a so-called bias power, is applied to the lower electrode 31 so as to draw ions in a plasma into the wafer W. A focus ring 39 is disposed on an outer circumference of the lower electrode 31 so as to surround the electrostatic chuck 34. Thus, when a plasma is generated, the plasma can focus on the wafer W placed on the stage 3 via the focus ring 39.

The upper electrode 4 is formed to have a hollow structure. A number of holes 41 for supplying a process gas into the processing vessel 2 in a dispersed manner are uniformly, for example, formed in a lower surface of the upper electrode 4, so that a so-called gas showerhead is constituted. A gas inlet pipe 42 serving as a gas supply channel is connected to a center of an upper surface of the upper electrode 4. The gas inlet pipe 42 passes through the center of the upper surface of the processing vessel 2 via an insulation member 43. The gas inlet pipe 42 is branched into, e.g., three branch pipes 42A to 42C on an upstream side. The branch pipes 42A to 42C are respectively connected to gas supply sources 44A to 44C via valves VA to VC and flow-rate controllers 43A to 43C. The valves VA to VC and the flow-rate controllers 43A to 43C are structural elements constituting a so-called gas supply system 45. Based on a control signal from a control part 100 which is described below; it is possible to control supply and stop (not-supply) of respective gases from the respective gas supply sources 44A to 44C, and to control flow rates of the respective gases.

In this example, the gas supply source 44A, the gas supply source 44B, and the gas supply source 44C respectively correspond to a cleaning-gas supply source, a film depositing gas (CFxHy gas) supply source, and an etching-gas supply source. The gas supply source 44A, the valve VA, and the flow-rate controller 43A correspond to a first supply unit configured to supply a cleaning gas into the processing vessel 2. The gas supply source 44B, the valve VB, and the flow-rate controller 43B correspond to a second supply unit configured to supply a film depositing gas containing a CFxHy gas into the processing vessel 2. The gas supply source 44C, the valve VC, and the flow-rte controller 43C correspond to a third supply unit configured to supply an etching gas into the processing vessel 2.

The upper electrode 4 is grounded via a lowpass filter (LPF) 54. Connected via a matching device 56 to the upper electrode 4 is a radiofrequency power supply 55 that supplies a radiofrequency of, e.g., 60 MHz, which is higher than the radiofrequency supplied from the radiofrequency power supply 52. The radiofrequency from the radiofrequency power supply 55 connected to the upper electrode 4 acts in such a manner that a cleaning gas, a film depositing gas, and an etching gas are made plasma respectively. Namely, the radiofrequency power supply 55 serves as a plasma-generating unit.

Parts (areas) that are to be exposed to a plasma inside the processing vessel 2, e.g., the inner wall surface of the processing vessel 2 and the outer surfaces of the structural elements such as the stage 3 and the focus ring 39, are coated with Y (yttria). The yttria coating process is performed by, for example, thermally spraying yttria over all the inner wall surface of the processing vessel 2 and the outer surfaces of the structural elements.

The plasma etching apparatus is provided with the control part 100 formed of, e.g., a computer. The control part 100 includes a program, a memory, and a data processing part formed of a CPU. The program incorporates commands for sending control signals from the control part 100 to the respective units of the plasma etching apparatus so as to implement the respective below-described steps. The memory has an area in which values of various process parameters such as a process pressure, a process period, a gas flow rate, and an electric power are written. When the CPU implements the commands of the program, predetermined values of the process parameters are read out, and control signals corresponding to the parameter values are sent to the respective units of the plasma etching apparatus. The program (which may further include a program relating to an input operation of the process parameters and a display thereof) is generally stored in a storage part formed of a computer storage medium such as a flexible disc, a compact disc, or an MO (photomagnetic disc), and is installed in the control part 100.

Figure 2:
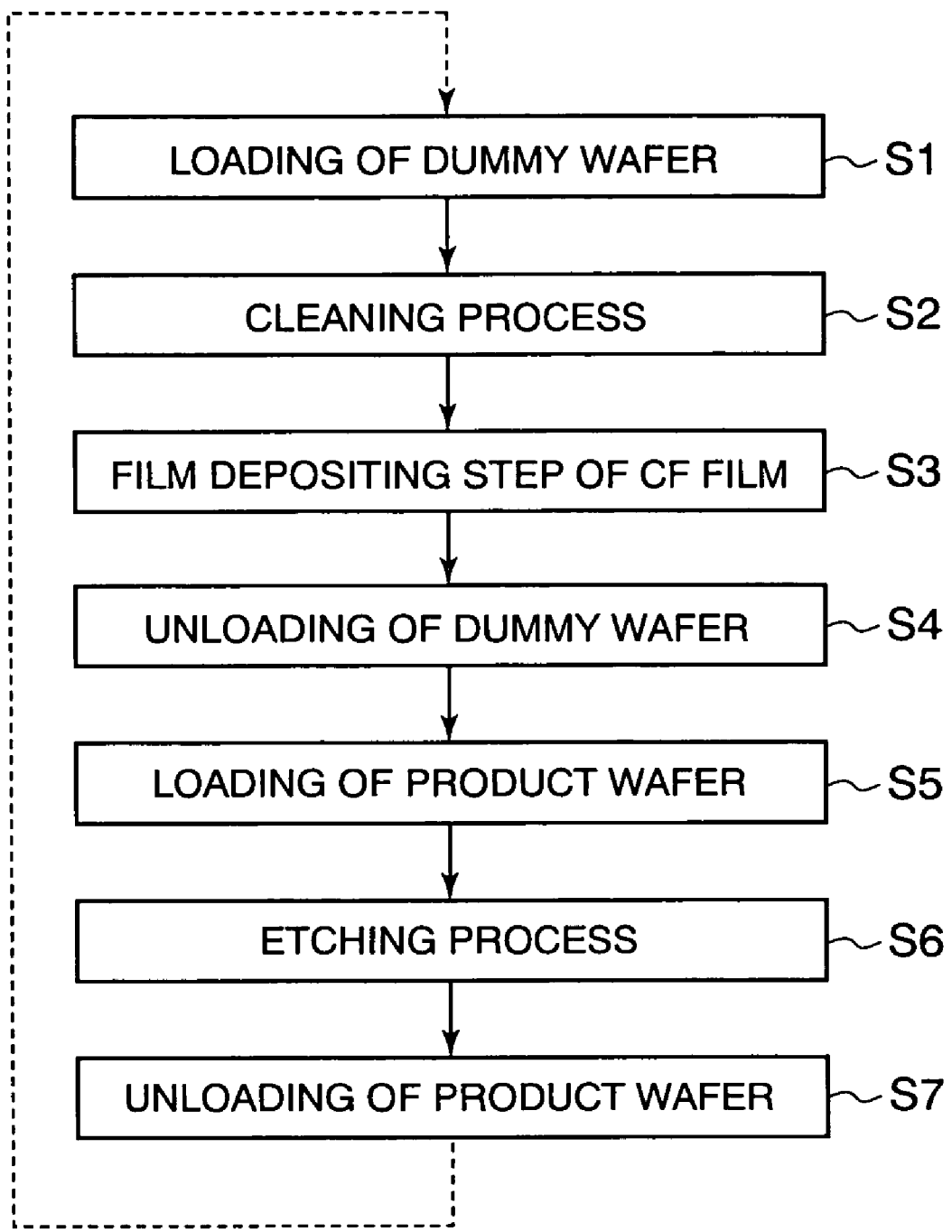
FIG. 2 is a flowchart showing one embodiment of an etching method according to the present invention.

Next, with reference to FIGS. 2 to 4, given as an example to describe one embodiment of a plasma etching method according to the present invention performed with the use of the plasma etching apparatus is a case in which an SiN film formed on the surface of a wafer W is etched.

(Step S1: Loading Process of Dummy Wafer DW)

Figure 3A:
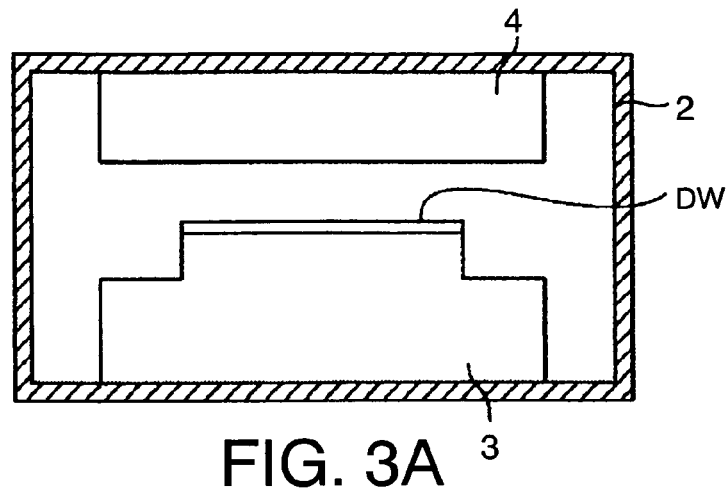
FIGS. 3A to 3C and FIGS. 4A to 4C are schematic sectional views of an etching apparatus for explaining the one embodiment of the etching method according to the present invention.

The gate valve G is opened at first, and a 300 mm (12 inch) dummy wafer DW is loaded into the processing vessel 2 by a transfer mechanism, not shown, (see, FIG. 3A). After the dummy wafer DW has been horizontally placed on the stage 3, the dummy wafer DW is electrostatically absorbed. Thereafter, the transfer mechanism is retracted from the processing vessel 2, and the gate valve G is closed. Subsequently, a backside gas is supplied from the gas channel 38. After that, the following steps are performed, for example.

(Step S2: Cleaning Process of Inside of Processing Vessel)

Figure 3B:
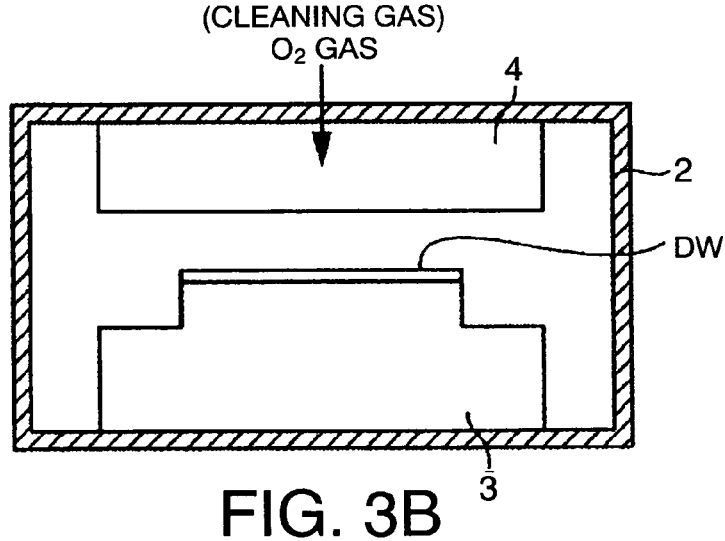

Then, as shown in FIG. 3B, the processing vessel 2 is evacuated by the vacuum exhaust unit 24 through the exhaust pipe 23. Thus, the inside of the processing vessel 2 is maintained at a predetermined vacuum degree of, e.g., 13.3 Pa (100 mTorr). Thereafter, a cleaning gas, such as a mixture gas of an $O_2$ gas and an $SF_6$ gas, is supplied at flow rates of $O_2$ gas/$SF_6$ gas=300 sccm/300 sccm, through the gas supply system 45 for 30 seconds. On the other hand, a radiofrequency of 1000 W whose frequency is 60 MHz is supplied to the upper electrode 4, so that the cleaning gas is made plasma.

At this time, a deposit including, e.g., a CF film 21, which has been deposited inside the processing vessel 2 during a previous etching process for a previous wafer W, and/or another material, which has been generated during the previous etching process for the previous wafer W, has been deposited on the inner wall surface of the processing vessel 2 and the outer surfaces of the structural elements such as the stage 3. However, since the plasma contains active species of oxygen, when the deposit is exposed to the active species atmosphere, the deposit is decomposed by the active species of oxygen, and then the decomposed deposit together with the atmosphere in the processing vessel 2 is discharged outside the processing vessel 2 through the exhaust pipe 23. Thus, the deposit inside the processing vessel 2 can be removed.

(Step S3: CF-Film Depositing Process Inside Processing Vessel 2)

Figure 3C:
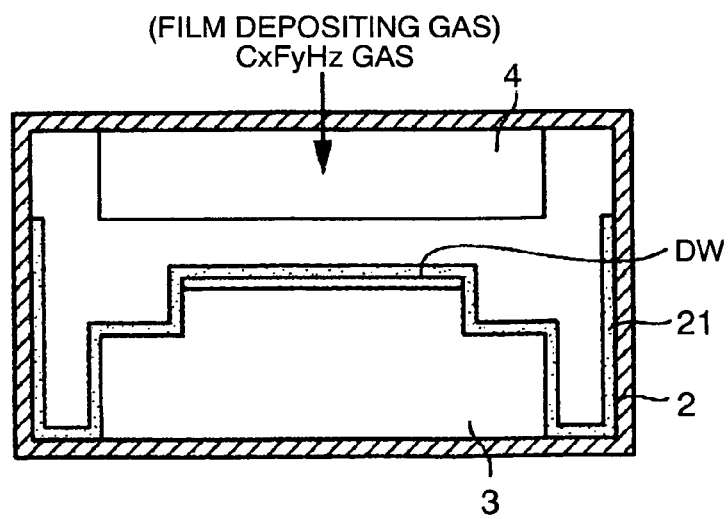

Then, as shown in FIG. 3C, the processing vessel 2 is evacuated by the vacuum exhaust unit 24 through the exhaust pipe 23. Thus, the inside of the processing vessel 2 is maintained at a predetermined vacuum degree of, e.g., 26.7 Pa (200 mTorr). Thereafter, film depositing gases, such as a $CF_4$ gas and a $CH_3F$ gas, are supplied, at flow rates of 250 sccm and 140 sccm, respectively, through the gas supply system 45 for 90 seconds, for example. On the other hand, a radiofrequency of 600 W whose frequency is 60 MHz is supplied to the upper electrode 4, so that the film depositing gases are made plasma.

The plasma contains active species of carbon, fluorine, and hydrogen. Thus, a CF film 21 is deposited on areas exposed to the plasma in the processing vessel 2, i.e., on the inner wall surface of the processing vessel 2 and on the outer surfaces of the structural elements such as the stage 3.

(Step 4: Unloading Process of Dummy Wafer DW)

Figure 4A:
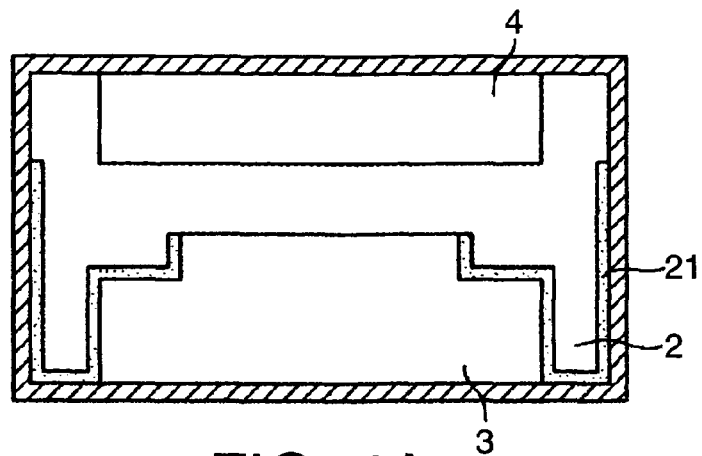
Figure 4B:
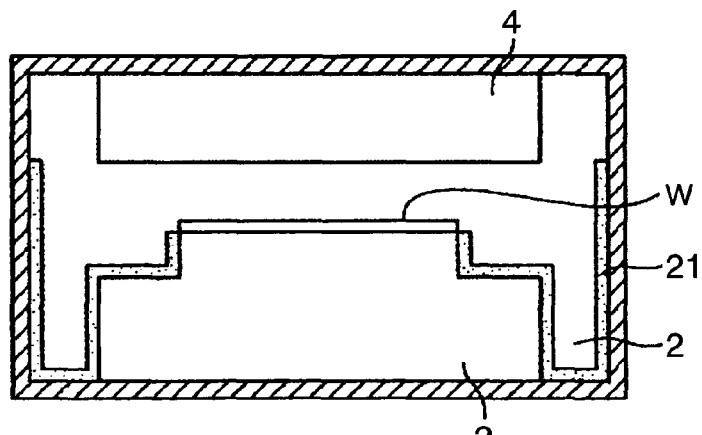

Then, the dummy wafer DW is unloaded from the processing vessel 2 (see, FIG. 4A).

(Step 5: Loading Process of Product Wafer W)

Following thereto, a product wafer W is loaded into the processing vessel 2, and is electrostatically absorbed on the stage 3 as described above (see, FIG. 4B).

(Step S6: Etching Process of Product Wafer W)

Figure 4C:
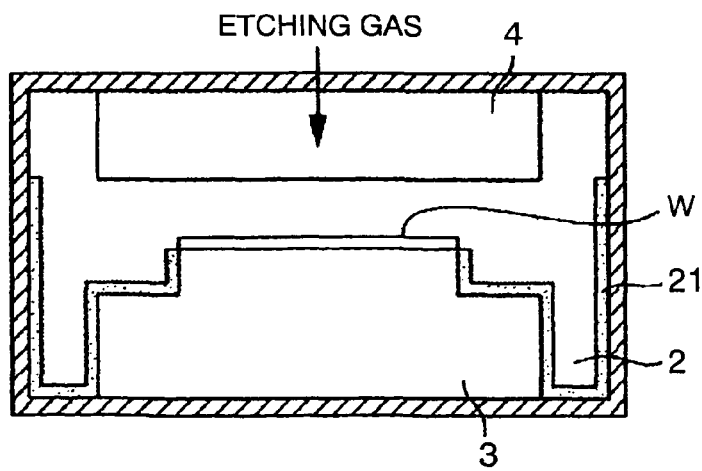
Figure 5:
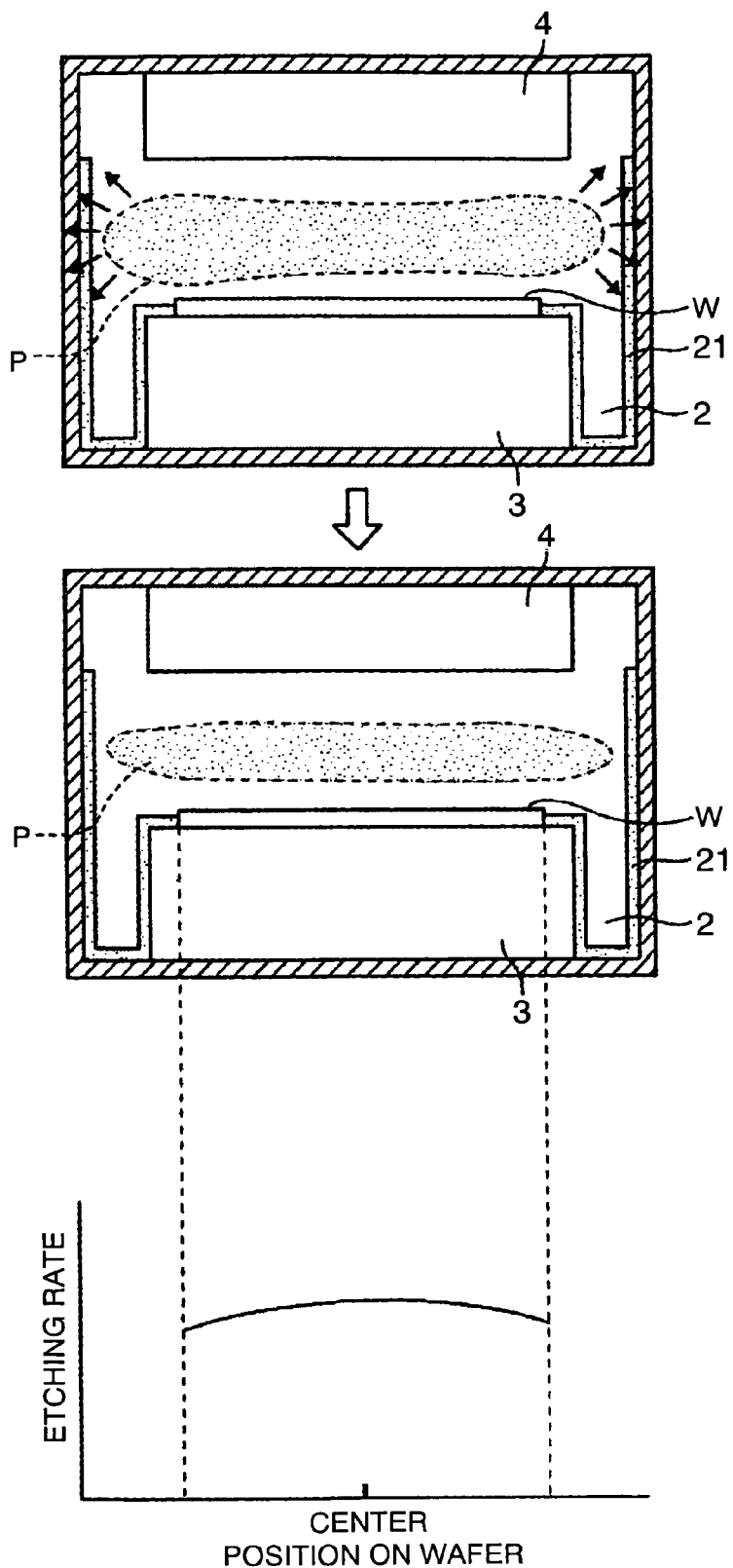
FIG. 5 is an explanatory view for explaining an operation of the one embodiment of the etching method according to the present invention.

Then, as shown in FIG. 4C, the processing vessel 2 is evacuated by the vacuum exhaust unit 24 through the exhaust pipe 23. Thus, the inside of the processing vessel 2 is maintained at a predetermined vacuum degree of, e.g., 2.67 Pa (20 mTorr). Thereafter, etching gases, such as a $CF_4$ gas, a $CHF_3$ gas, and an Ar gas, are supplied at flow rates of 250 sccm, 70 sccm, and 200 sccm, respectively, through the gas supply system 45 for 30 seconds, for example. On the other hand, a radiofrequency of 700 W whose frequency is 60 MHz is supplied to the upper electrode 4, so that the etching gases are made plasma. At the same time, a radiofrequency of 550 W whose frequency is 13.56 MHz is supplied to the stage (lower electrode) 3.

The plasma contains active species of carbon, fluorine, and hydrogen. Thus, the SiN film on the surface of the wafer W reacts with the active species so that the etching process proceeds. The CF film 21 which has been formed inside the processing vessel 2 in the film depositing step has the same components (constitution) as those of the etching gases. Thus, even when the CF film 21 is exposed to the plasma of the etching gases, there is no possibility that a component different from the etching gases is scattered in the processing vessel 2 so as to adversely affect the etching process.

(Step S7: Unloading Process of Product Wafer W)

After the product wafer W has been subjected to the etching process, the product wafer W is unloaded from the processing vessel 2. In this manner, the processes for the product wafer W are completed.

When a series of processes is continuously performed for a succeeding wafer W, the dummy wafer DW is again loaded into the processing vessel 2, and the steps S1 to S7 are performed. Namely, for each time one wafer W is processed, the process for cleaning the processing vessel 2, the process for depositing the CF film 21 on the processing vessel 2, the process for etching the product wafer W, are repeated in this order.

According to the above embodiment, owing to the deposition of the CF film 21 onto the inner wall surface of the processing vessel 2, the etching-rate profile in the plane of the wafer W can be suitably controlled, which will be apparent from the below examples. Specifically, by optimizing the film depositing conditions when the CF film 21 is deposited on the inner wall surface of the processing vessel 2, namely, by varying the film depositing conditions such as the kind of a film depositing gas, the film depositing period, and the flow rate ratio between film depositing gases, it is possible to control the etching-rate profile such that an etching rate in the central area of the wafer W and an etching rate in the peripheral area of the wafer W are equal to each other, even in a process in which the etching rate in the peripheral area of the wafer W is likely to be higher than the etching rate in the central area thereof, without changing the etching process itself for the wafer W.

The reason therefor is surmised as follows. Since the CF film 21 has been formed on the sidewall (inner wall) of the processing vessel 2, the CF film 21 and the active species obtained by the plasma of the etching gas react with each other, so that the active species are consumed. By varying the film depositing conditions such as the kind of a film depositing gas and the flow rate ratio between film depositing gases, the active species are differently consumed under the various conditions. Thus, the following cases are supposed. Namely, there may be a case in which the amount of active species in an area nearer to the sidewall of the processing vessel 2 is larger than that in the central area thereof. There may be a case in which the amount of active species is substantially uniform over the area near to the sidewall of the processing vessel 2 and the central area thereof. Alternatively, there may be case in which the amount of active species in the central area of the processing vessel 2 is larger than that in the area nearer to the peripheral area thereof. In any case, by making suitable the film depositing conditions, it is possible to obtain an etching-rate profile in which the amount of the active species contributing to the etching of the wafer W is decreased in an area nearer to the sidewall of the processing vessel 2, so that the etching rate in the peripheral area of the wafer W is smaller than the etching rate in the central area thereof.

Thus, when there is etched a film such as a gate electrode or an anti-reflection film, which is likely to be etched in such a manner that an etching rate in the peripheral area of the wafer W is higher than an etching rate in the central area thereof, it becomes easier to control the etching conditions in order to improve an in-plane uniformity of the etching rate. Namely, by adjusting the film depositing conditions, it is easy to obtain an etching-rate profile in which an etching rate in the peripheral area of the wafer W is lower than an etching rate in the central area thereof, although such a profile has been conventionally difficult to be achieved. In addition to this control, by controlling other conditions such as by varying the supply rate of the etching gas within the surface of the wafer W and/or by varying the temperature of the stage within the surface of the wafer W, an improved in-plane uniformity of the etching rate can be more easily obtained.

Further, since the CF film 21 has been previously formed on the parts (areas) exposed to the plasma in the processing vessel 2 prior to the etching process for the wafer W, a metal component such as yttrium constituting the inner surface of the processing vessel 2 and/or the outer surface of the structural element is restrained from being scratched by sputtering during the etching process so as to generate particles which may then adhere to the wafer W. Namely, since the CF film 21 has been formed on the surface of the processing vessel 2 and the like, the inner wall surface of the processing vessel 2 and the like can be restrained from being directly exposed to the active species of the etching gas during the etching process. That is, the inner wall surface of the processing vessel 2 can be protected from the sputtering of the etching gas by means of the CF film 21. Thus, an amount of the metal component that was conventionally undesirably etched can be significantly decreased.

Furthermore, exhaust of the metal component constituting the processing vessel 2 and the structural element by the plasma can also be restrained. Thus, the life spans of these members can be elongated. This leads to elongation of the exchange cycles of these members, which decreases a cost for a part per time (COC).

In addition, there may be employed a method in which the processing vessel 2 is cleaned after etching processes for a plurality of wafers W have been performed.

However, the above explained method, in which the cleaning process and the succeeding film depositing process are performed for each time one wafer W is etched, is advantageous in that uniformity of the processes between surfaces of wafers can be improved, because every wafer is subjected to the etching process under the same condition, i.e., the plurality of wafers W are subjected to the etching process under the same condition.

In the above example, the cleaning step and the film depositing step are performed, with the dummy wafer DW being placed on the stage 3. However, the cleaning step and the film depositing step may be performed, without the dummy wafer DW being placed on the stage 3. In this case, although the CF film 21 is deposited on the surface of the stage 3 in the film depositing step, the formation of the CF film 21 does not discourage at all the electrostatic absorption of the product wafer W when it is placed on the stage 3 (this has been confirmed by the experiment conducted by the inventors).

EXAMPLES

With the use of the plasma etching apparatus shown in FIG. 1, the cleaning process, the film depositing process of a CF film, and the etching process were performed in this order based on the steps S1 to S7 shown in FIG. 2. The etching process was performed to an SiN film formed on a wafer W. Regarding the cleaning process and the etching process, conditions common to the respective examples were employed. However, regarding the film depositing process of the CF film 21, a film depositing gas, a radiofrequency power, and a process period were varied as described below, while a process pressure of 26.6 Pa was unchanged.

With respect to each of the wafers W which had been etched in accordance with the above conditions, an average value of the etching rate, an in-plane uniformity of the etching rate, and the number of yttrium atoms on the wafer W were measured.

The average value of the etching rate was calculated from values measured at 33 measuring points located in the diametrical direction of the wafer W.

The in-plane uniformity of the etching rate was calculated by Nano Spec 8300X.

The number of yttrium atoms was measured by a detection device formed of TREX.

FIG. 6 shows the film depositing conditions for each of the respective examples and for a comparative example (samples), and the measured results of the average value of the etching rate, the in-plane uniformity, and the number of yttrium atoms. The sample 1 is the comparative example in which the cleaning process and the etching process were performed in the processing vessel 2 without performing the film depositing process of the CF film.

The cleaning conditions and the etching conditions were as follows.

[Cleaning Conditions]
Pressure in Processing Vessel 2: 13.3 Pa (100 mTorr)
Cleaning Gas: $O_2$ gas/$SF_6$ gas=600 sccm/600 sccm
Radiofrequency Power (Upper Electrode 4): Frequency 60 MHz, 1000 W
Process Period: 30 seconds
[Etching Conditions]
Pressure in Processing Vessel 2: 2.67 Pa (20 mTorr)
Etching Gas: $CF_4$ gas 250 sccm, $CHF_3$ gas 70 sccm, Ar gas 200 sccm, $O_2$ gas 7 sccm
Radiofrequency Power (Upper Electrode 4): Frequency 60 MHz, 700 W
Radiofrequency Power (stage 3): Frequency 13.56 MHz, 550 W
Process Period: 30 seconds <Dependency of Etching Rate on Film Depositing Gas>

Figure 7:
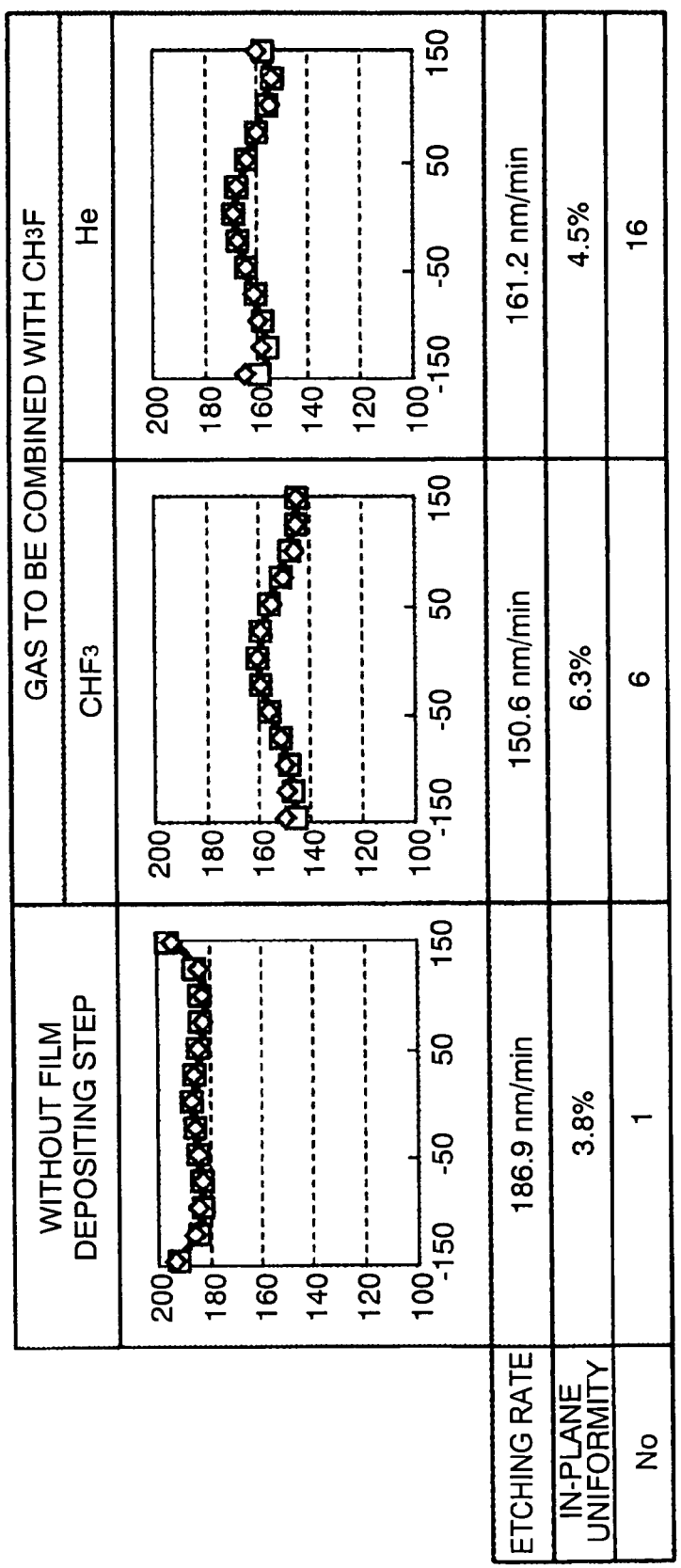
FIG. 7 is a characteristic diagram showing etching-rate profiles measured for the samples 1, 6, and 16 by comparison.

From the results of the samples 1, 6, and 16, how the etching-rate profile was affected when the kind of the film depositing gas was changed in the film depositing step of the CF film was confirmed. FIG. 7 shows the etching-rate profile results of these samples. The film depositing gases used for the sample 6 were a $CHF_3$ gas: 250 sccm and a $CH_3F$ gas: 140 sccm, and the film depositing gases used for the sample 16 were a $CH_3F$ gas: 140 sccm and an He gas: 250 sccm.

It is recognized that the etching-rate profile can be controlled such that the etching rate in the peripheral area of the wafer W is smaller than the etching rate in the central area thereof, by using a $CHF_3$ gas as a gas to be combined with the $CH_3F$ gas. In addition, it is recognized that the etching-rate profile differs depending on a case whether a $CFH_3$ gas or an He gas is used as a gas to be combined with the $CH_3F$ gas. From these results, it is confirmed that the etching-rate profile can be controlled by adjusting the kind of the film depositing gas in the film depositing step.

<Dependency of Etching Rate on Process Period>

Figure 8:
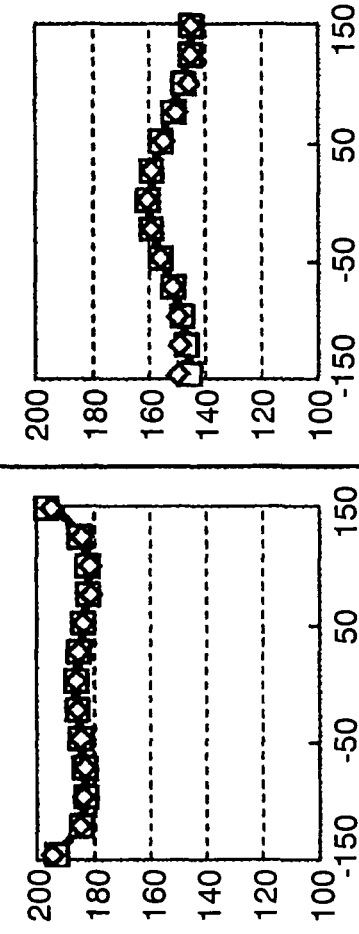
FIG. 8 is a characteristic diagram showing etching-rate profiles measured for the samples 1, 6, and 10 by comparison.

From the results of the samples 1, 6, and 10, how the etching-rate profile was affected when the process period was changed in the film depositing step of the CF film was confirmed. FIG. 8 shows the etching-rate profile results of these samples. A $CHF_3$ gas and a $CH_3F$ gas were used in the samples 6 and 10 as film depositing gases. However, the process period for the sample 6 was 30 seconds, while the process period for the sample 10 was 90 seconds.

Figure 9:
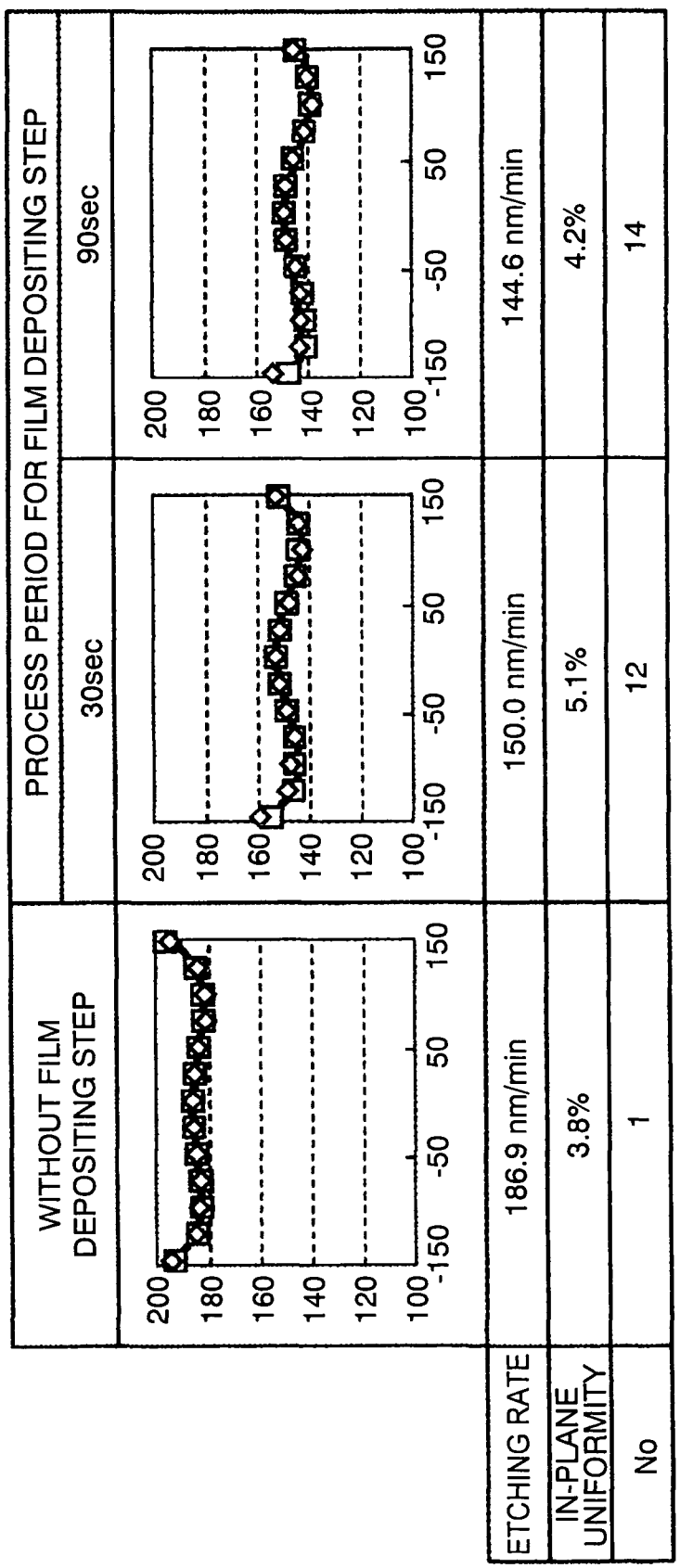
FIG. 9 is a characteristic diagram showing etching-rate profiles measured for the samples 1, 12, and 14 by comparison.

Further, FIG. 9 shows the results when a $CHF_3$ gas and a $CH_2F_2$ gas were used as film depositing gases (samples 12 and 14). The process period for the sample 12 was 30 seconds, while the process period for the sample 14 was 90 seconds.

It is recognized that the etching-rate profile can be made different by changing the process period in the film depositing step. Thus, it is confirmed that the etching-rate profile can be controlled by adjusting the process period.

<Dependency of Etching Rate on Film Depositing Gas Ratio>

Figure 10:
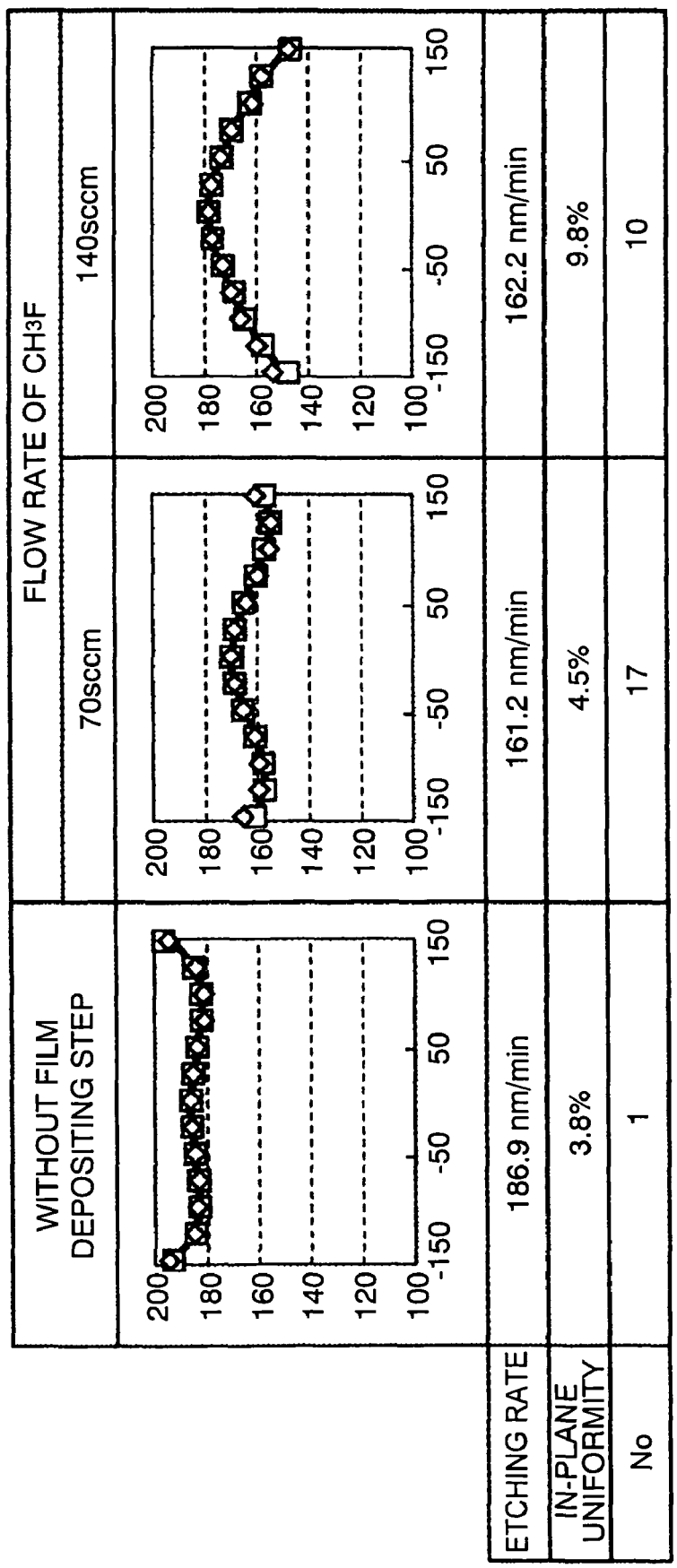
FIG. 10 is a characteristic diagram showing etching-rate profiles measured for the samples 1, 17, and 10 by comparison.

From the results of the samples 1, 17, and 10, how the etching-rate profile was affected when the gas ratio between the film depositing gases was changed in the film depositing step of the CF film was confirmed. FIG. 10 shows the etching-rate profile results of these samples.

A $CHF_3$ gas and a $CH_3F$ gas were used in the samples 17 and 10 as film depositing gases. However, the gas ratio between the film depositing gases of the sample 17 was $CHF_3$ gas: $CH_3F$ gas=250 sccm:70 sccm, while the gas ratio between the film depositing gases of the sample 10 was $CHF_3$ gas: $CH_3F$ gas=250 sccm: 140 sccm.

Figure 11:
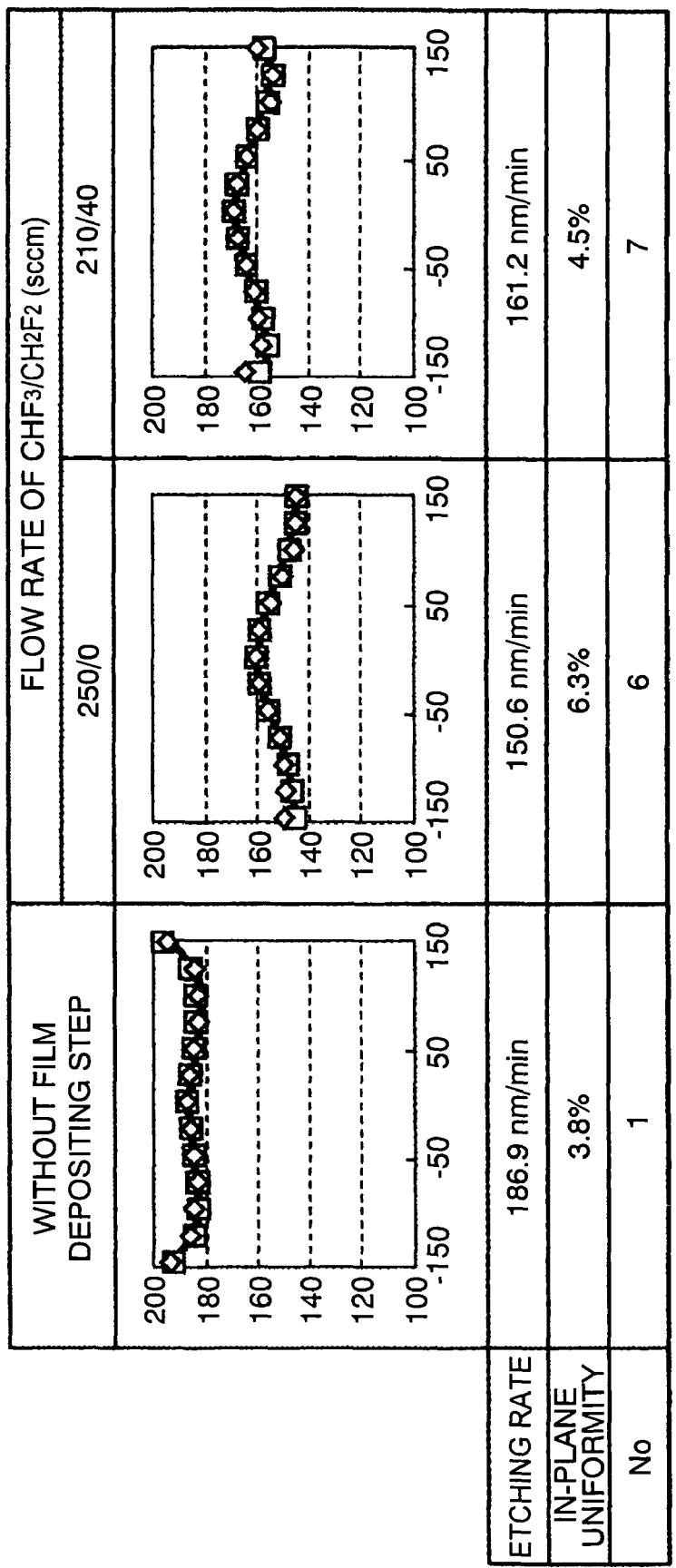
FIG. 11 is a characteristic diagram showing etching-rate profiles measured for the samples 1, 6, and 7 by comparison.

In addition, FIG. 11 shows the results when a $CHF_3$ gas, a $CH_2F_2$ gas, and a $CH_3F$ gas were used as film depositing gases (samples 6 and 7). The gas ratio between the film depositing gases of the sample 6 was $CHF_3$ gas: $CH_2F_2$ gas: $CH_3F$ gas=250 sccm:0 sccm:140 sccm, while the gas ratio between the film depositing gases of the sample 7 was $CHF_3$ gas: $CH_2F_2$ gas: $CH_3F$ gas=210 sccm:40 sccm:140 sccm.

From these results, it is recognized that the etching-rate profile can be made different by changing the gas ratio between the film depositing gases in the film depositing step. Thus, it is confirmed that the etching-rate profile can be controlled by adjusting the gas ratio.

From the above results, it is recognized that the etching rate differs between the cases in which the film depositing step is performed (samples 2 to 17) and the case in which the film depositing step is not performed (sample 1). As compared with the case in which the film depositing step is not performed, the etching rate is decreased by the performance of the film depositing step.

By changing the film depositing conditions such as the kind of the film depositing gas, the gas ratio (gas flow rate ratio), and the process period in the film depositing step, there can be obtained various etching-rate profiles, such as an etching-rate profile in which an etching rate in a peripheral area of a wafer W is smaller than an etching rate in a central area thereof, and an etching-rate profile in which an etching rate is decreased from a central area of a wafer W toward an outside area thereof but is again increased in a peripheral area thereof. In other words, the etching-rate profile can be suitably controlled.

<Number of Yttrium Atoms on Wafer>

Figure 12:
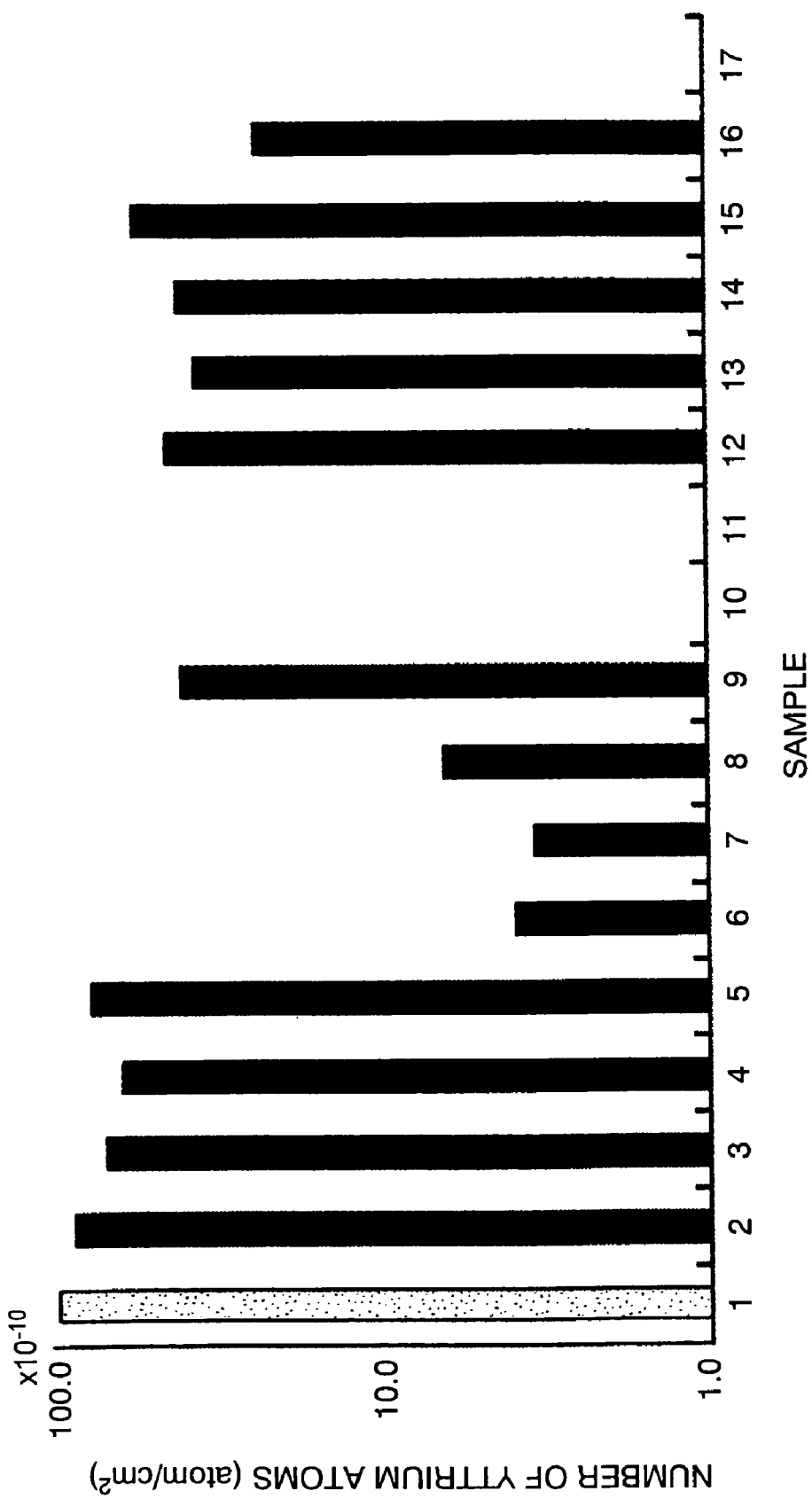
FIG. 12 is a view showing the number of yttrium atoms measured for the respective samples.
Figure 13:
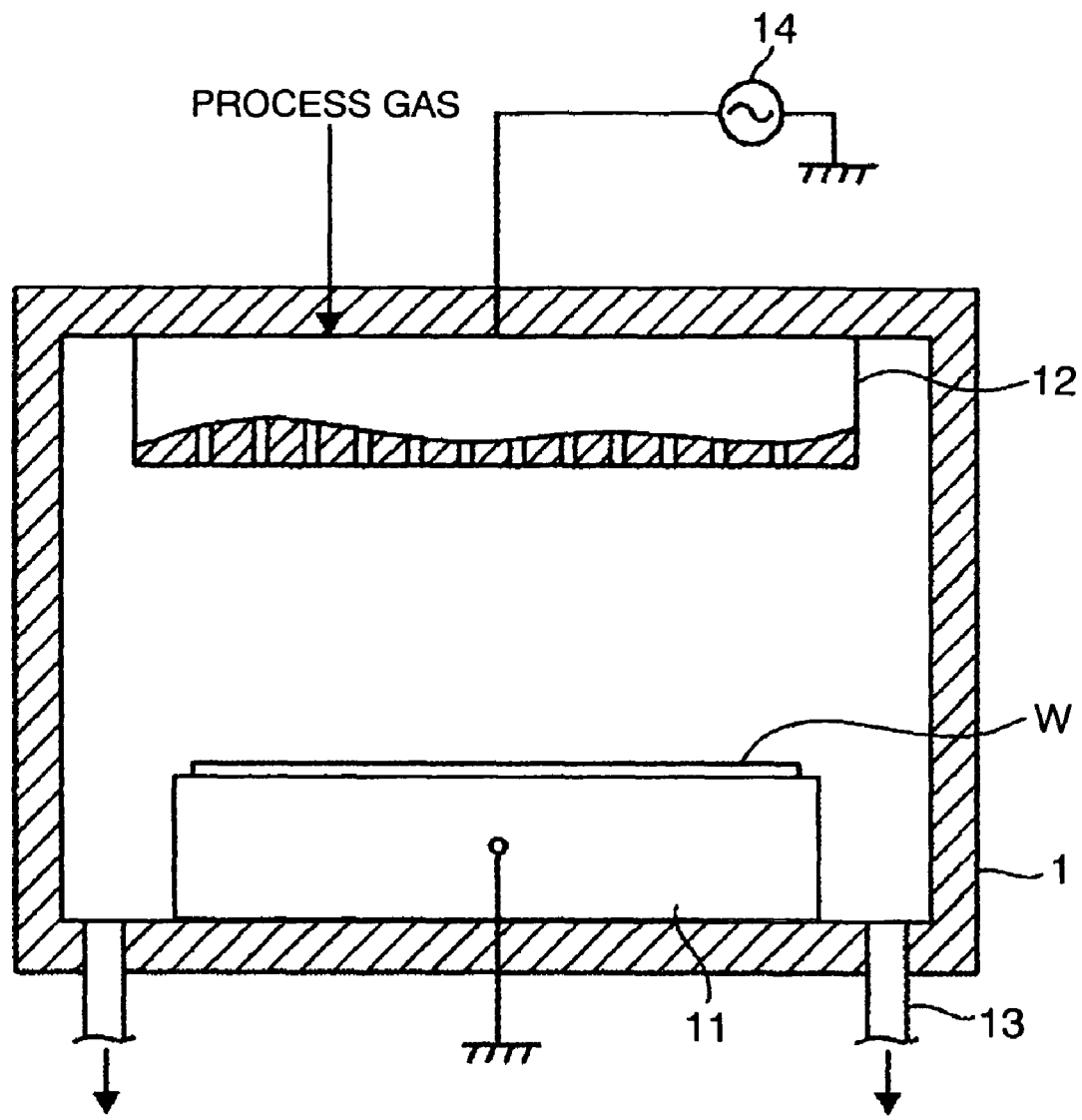
FIG. 13 is a schematic sectional view showing an example of a conventional etching apparatus.
Figure 14:
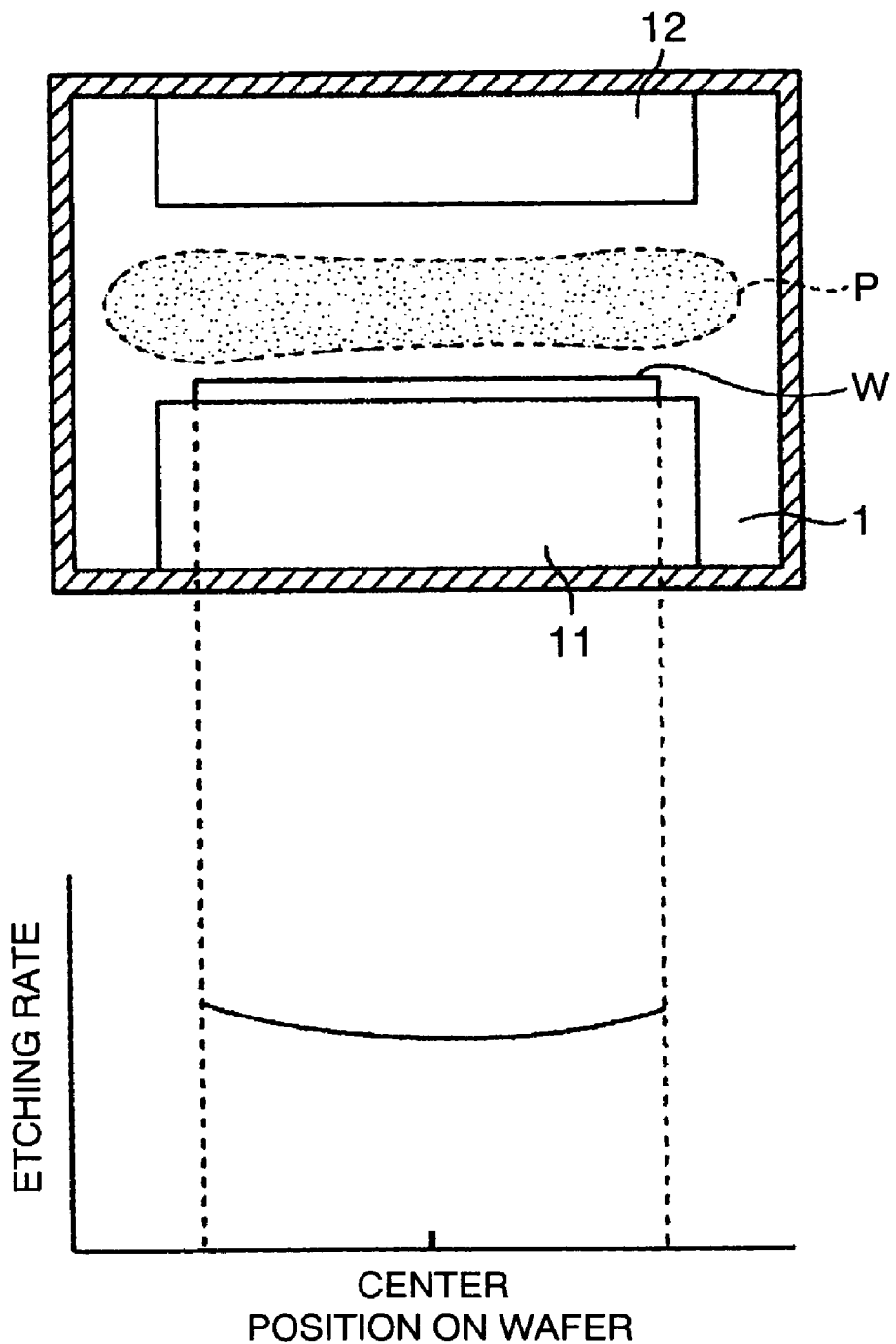
FIG. 14 is an explanatory view for explaining an operation of an example of a conventional etching method.

FIG. 12 is a bar chart showing the numbers of yttrium atoms on the wafers of the respective samples which were measured in the above examples. The numbers of yttrium atoms of the samples 10, 11, and 17 were less than a detection limit of the detection device (the number of yttrium atoms could not be measured).

From the result of FIG. 12, it is recognized that the number of yttrium atoms in the cases in which the film depositing step is performed (samples 2 to 17) is smaller than that in the case in which the film depositing step is not performed (sample 1). Namely, it is recognized that, due to the performance of the film depositing step, the yttrium contamination can be restrained.

In view of the fact that the numbers of yttrium atoms on the samples 10, 11, and 17 were less than $4 \times 10^9$ atom/$cm^2$ that was a lowermost detection limit, it can be understood that a state in which yttrium is unlikely to be etched can be realized by suitably selecting the film depositing conditions for the film depositing step.

In the above description, the method for generating a plasma is not limited to the aforementioned example. Moreover, the substrate may be an FPD substrate or an LCD substrate instead of the semiconductor wafer W.

The invention claimed is:

1. A plasma etching method comprising:
a cleaning step (a) in which a cleaning gas is supplied into a processing vessel and the cleaning gas is made plasma, so that a deposit adhering to an inside of the processing vessel is removed by means of the plasma;
a film depositing step (b), succeeding the cleaning step (a), in which a film depositing gas containing carbon and fluorine is supplied into the processing vessel and the film depositing gas is made plasma, so that a film containing carbon and fluorine is deposited on the inside of the processing vessel by means of the plasma;
an etching step (c), succeeding the film depositing step (b), in which a substrate is placed on a stage inside the processing vessel, and an etching gas is supplied into the processing vessel and the etching gas is made plasma, so that the substrate is etched by means of the plasma; and
an unloading step (d), succeeding the etching step (c), in which the substrate is unloaded from the processing vessel, wherein
after the unloading step (d) has been finished, the cleaning step (a) to the unloading step (d) are repeated again, and the film depositing step (b) is performed with a dummy substrate being placed on the stage.

2. The plasma etching method according to claim 1, wherein
the cleaning step (a) to the unloading step (d) are performed for every substrate.

3. The plasma etching method according to claim 1, wherein
the cleaning gas is one of an oxygen gas, a mixture gas of an oxygen gas and an $SF_6$ gas, and a mixture gas of an oxygen gas and an $NF_3$ gas.

4. The plasma etching method according to claim 1, wherein
the film depositing gas is a CxFyHz gas (in which x and y are integers not less than 1, and z is 0 or an integer not less than 1).

5. The plasma etching method according to claim 1, wherein
the deposit includes a film containing carbon and fluorine deposited on the inside of the processing vessel.

* * * * *